United States Patent
Chen et al.

(10) Patent No.: US 8,711,077 B2
(45) Date of Patent: Apr. 29, 2014

(54) LCD DRIVING CIRCUIT IN WHICH SHIFT REGISTER UNITS ARE DRIVEN BY A FIRST CLOCK SIGNAL OF FIXED DUTY/AMPLITUDE AND A SECOND CLOCK SIGNAL OF VARIABLE DUTY/AMPLITUDE

(75) Inventors: Kuan-Yu Chen, Hsin-Chu (TW); Yi-Suei Liao, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 348 days.

(21) Appl. No.: 13/080,617

(22) Filed: Apr. 5, 2011

(65) Prior Publication Data

US 2012/0113068 A1 May 10, 2012

(30) Foreign Application Priority Data

Nov. 10, 2010 (TW) .............................. 99138660 A

(51) Int. Cl.
G09G 3/36 (2006.01)

(52) U.S. Cl.
USPC ............................................. 345/99; 377/68

(58) Field of Classification Search
CPC ...... G11C 19/28; G11C 19/184; G11C 19/00; G11C 27/04; G11C 19/285; G11C 19/287; G11C 8/04; G11C 19/188; G11C 19/182; G11C 11/34; G09G 3/3677; G09G 3/3688; G09G 2310/0286; G09G 2310/0267; G09G 3/3674; H03K 19/096; H03K 5/135; H03K 5/15093; H03K 5/249
USPC ................... 345/60–104, 204–215, 690–699; 377/57–81

See application file for complete search history.

(56) References Cited

U.S. PATENT DOCUMENTS

| | | | | |
|---|---|---|---|---|
| 7,050,034 B2 * | 5/2006 | Uchino et al. | ................... | 345/99 |
| 7,296,247 B1 * | 11/2007 | Hart | .............................. | 716/132 |
| 8,018,451 B2 * | 9/2011 | Park | .............................. | 345/213 |
| 2005/0184946 A1 * | 8/2005 | Pyoun et al. | ..................... | 345/94 |
| 2007/0001980 A1 * | 1/2007 | Bae | ................................ | 345/98 |
| 2007/0052646 A1 | 3/2007 | Ishiguchi | | |
| 2008/0122829 A1 * | 5/2008 | Park | ............................. | 345/213 |
| 2008/0143759 A1 * | 6/2008 | Chien et al. | ................... | 345/698 |
| 2011/0069806 A1 | 3/2011 | Liao | | |
| 2012/0091925 A1 | 4/2012 | Uehara | | |

FOREIGN PATENT DOCUMENTS

| | | |
|---|---|---|
| CN | 1847957 A | 10/2006 |
| CN | 1928682 A | 3/2007 |
| CN | 101833997 A | 9/2010 |
| JP | 2002335131 | 11/2002 |

* cited by examiner

Primary Examiner — Chanh Nguyen
Assistant Examiner — Navin Lingaraju
(74) Attorney, Agent, or Firm — Winston Hsu; Scott Margo

(57) ABSTRACT

An LCD device is configured to drive a plurality of shift register units using two clock signals having different driving abilities. Each shift register unit may thus generate a stronger signal for triggering a next-stage shift register unit, thereby improving cold-start. When the LCD device has been activated over a predetermined period of time, the driving ability of the clock signal having higher driving ability is gradually lowered, thereby reducing power consumption.

9 Claims, 12 Drawing Sheets

LCD DRIVING CIRCUIT IN WHICH SHIFT REGISTER UNITS ARE DRIVEN BY A FIRST CLOCK SIGNAL OF FIXED DUTY/AMPLITUDE AND A SECOND CLOCK SIGNAL OF VARIABLE DUTY/AMPLITUDE

BACKGROUND

1. Technical Field

The present invention is related to an LCD driving circuit and related driving method, and more particularly, to an LCD driving circuit and related driving method capable of improving cold-start.

2. Related Art

Liquid crystal display (LCD) devices, characterized in low radiation, thin appearance and low power consumption, have gradually replaced traditional cathode ray tube (CRT) displays and been widely used in notebook computers, personal digital assistants (PDAs), flat-panel TVs, or mobile phones. In a traditional LCD device, images are displayed by driving the pixels on an LCD panel using external source drivers and gate drivers. Recently, GOA (gate driver on array) technology has been developed in which the gate drivers are integrated in the LCD panel.

FIG. 1 is a diagram illustrating a prior art LCD device 100 using GOA technology. The LCD device 100 includes a display panel 110, a timing controller 120, a source driver 130, and a gate driver 140. A plurality of data lines $DL_1$-$DL_M$, a plurality of gate lines $GL_1$-$GL_N$, and a pixel array having a plurality of pixel units PX are disposed on the display panel 110. Each pixel unit PX, having a thin film transistor switch TFT, a liquid crystal capacitor $C_{LC}$ and a storage capacitor $C_{ST}$, is coupled to a corresponding data line, a corresponding gate line, and a common voltage $V_{COM}$. The timing controller 120 is configured to generate signals for operating the source driver 130 and the gate driver 140, such as a start pulse signal VST and clock signals $CK_1$-$CK_N$. The source driver 130 is configured to generate data driving signals $SD_1$-$SD_M$ associated with display images, thereby charging the corresponding pixel units PX. The gate driver 140 includes a plurality of shift register units $SR_1$-$SR_N$ coupled in series and configured to sequentially output gate driving signals $SG_1$-$SG_N$ to the corresponding gate lines $GL_1$-$GL_N$ according to the clock signals $CK_1$-$CK_N$ and the start pulse signal VST, thereby turning on the thin film transistor switches TFT in the corresponding pixel units PX.

In the prior art LCD device 100, each shift register unit selectively transmits the same clock signal to its output end and its corresponding next-stage shift register unit. In other words, the $1^{st}$ to $N^{th}$-stage shift register units $SR_1$-$SR_{N-1}$ also generate forward driving signals $SF_1$-$SF_{N-1}$ for respectively triggering the corresponding next-stage shift register units $SR_2$-$SR_N$ (the $1^{st}$-stage shift register unit $SR_1$ is triggered by the start pulse signal VST).

FIG. 2 is a diagram illustrating an $n^{th}$-stage shift register unit $SR_n$ among the prior art shift register units $SR_1$-$SR_N$. The prior art shift register unit $SR_n$ includes an output end $OUT_n$, a node $Q_n$, an input circuit 12, a pull-up circuit 14, a forward circuit 16, a first pull-down circuit 21, and a second pull-down circuit 22. The shift register unit $SR_n$ is configured to output the gate driving signal $SG_n$ to the gate line $GL_n$ at its output end $OUT_n$.

The pull-up circuit 14 includes a transistor switch T1 having a control end coupled to the node $Q_n$, a first end coupled to the clock signal $CK_n$, and a second end coupled to the output end $OUT_n$. The forward circuit 16 includes a transistor switch T2 having a control end coupled to the node $Q_n$, a first end coupled to the clock signal $CK_n$, and a second end coupled to the $(n+1)^{th}$-stage shift register unit $SR_{n+1}$. When the voltage level of the node $Q_n$ exceeds the turn-on voltage of the transistor switch T1, the clock signal $CK_n$ is transmitted to the output end $Q_n$ via the conducting transistor switch T1 for supplying the gate driving signal $SG_n$. When the voltage level of the node $Q_n$ exceeds the turn-on voltage of the transistor switch T2, the clock signal $CK_n$ is transmitted to the $(n+1)^{th}$-stage shift register unit $SR_{n+1}$ via the conducting transistor switch T2 for supplying the forward driving signal $SF_n$. The transistor switch T1 for providing gate driving signals normally has a much larger width/length (W/L) ratio than the transistor switch T2 for providing forward driving signals.

In GOA technology, the shift register units $SR_1$-$SR_N$ are manufactured in TFT processes. The turn-on current $I_{ON}$ of a thin film transistor switch is proportional to its W/L ratio, applied gate voltage $V_{GH}$ and the environmental temperature. Since the turn-on speed of the thin film transistor slows down as the temperature decreases, the shift register units $SR_1$-$SR_N$ suffers from cold-start in low-temperature environment (such as at the beginning of the start-up sequence). As previously illustrated, the transistor switch T2 with a much smaller W/L ratio encounters a larger fluctuation in turn-on current $I_{ON}$, resulting in a more deteriorated forward driving current which may not be able to trigger the corresponding next-stage shift register unit properly in low-temperature environment.

In low-temperature environment, the gate voltage $V_{GH}$ of the thin film transistor switch may be raised for increasing the turn-on current $I_{ON}$ in the prior art. For example, in the LCD device 100 illustrated in FIG. 1, the timing controller may includes a counter.

When starting to activate the shift register units $SR_1$-$SR_N$, the timing controller 120 is configured to output clock signals $CK_1$-$CK_N$ having larger pulse amplitude for increasing the gate voltages $V_{GH}$ supplied to the transistor switches T1 and T2. After the counter determines that the shift register units $SR_1$-$SR_N$ have been activated over a predetermined period of time, the timing controller 120 is configured to output clock signals $CK_1$-$CK_N$ having smaller pulse amplitude.

In the prior art, cold-start may be improved by switching between clock signals having two different pulse when driving the shift register units amplitudes. However, the sudden voltage change in gate voltage when the switching the clock signals result in voltage feed through, which may cause image flicker and influence display quality.

SUMMARY

The present invention provides a driving circuit of a liquid crystal display device including a plurality of shift register units. An $N^{th}$-stage shift register unit among the plurality of shift register units includes a node; an input circuit configured to maintain a voltage level of the node according to signals received from an $X^{th}$-stage shift register unit among the plurality of shift register units; a pull-up circuit configured to selectively couple a first clock signal to an output end of the $N^{th}$-stage shift register unit according to the voltage level of the node; a pull-down circuit configured to selectively couple a second clock signal to a $Y^{th}$-stage shift register unit among the plurality of shift register units according to the voltage level of the node; wherein a driving ability of the second clock signal is higher than a driving ability of the first clock signal, N is an integer larger than 1, X is a positive integer smaller than N, and Y is an integer larger than N.

The present invention further provides a method for driving a liquid crystal display device by providing a plurality of driving signals respectively during a plurality of driving periods. The method includes provides a first clock signal for supplying an $N^{th}$-stage driving signal among the plurality of driving signals and providing a second clock signal for supplying a trigger signal for an $(N+1)^{th}$-stage driving period among the plurality of driving periods during an $N^{th}$-stage driving period among the plurality of driving periods. A driving ability of the second clock signal is higher than a driving ability of the first clock signal, and N is a positive integer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
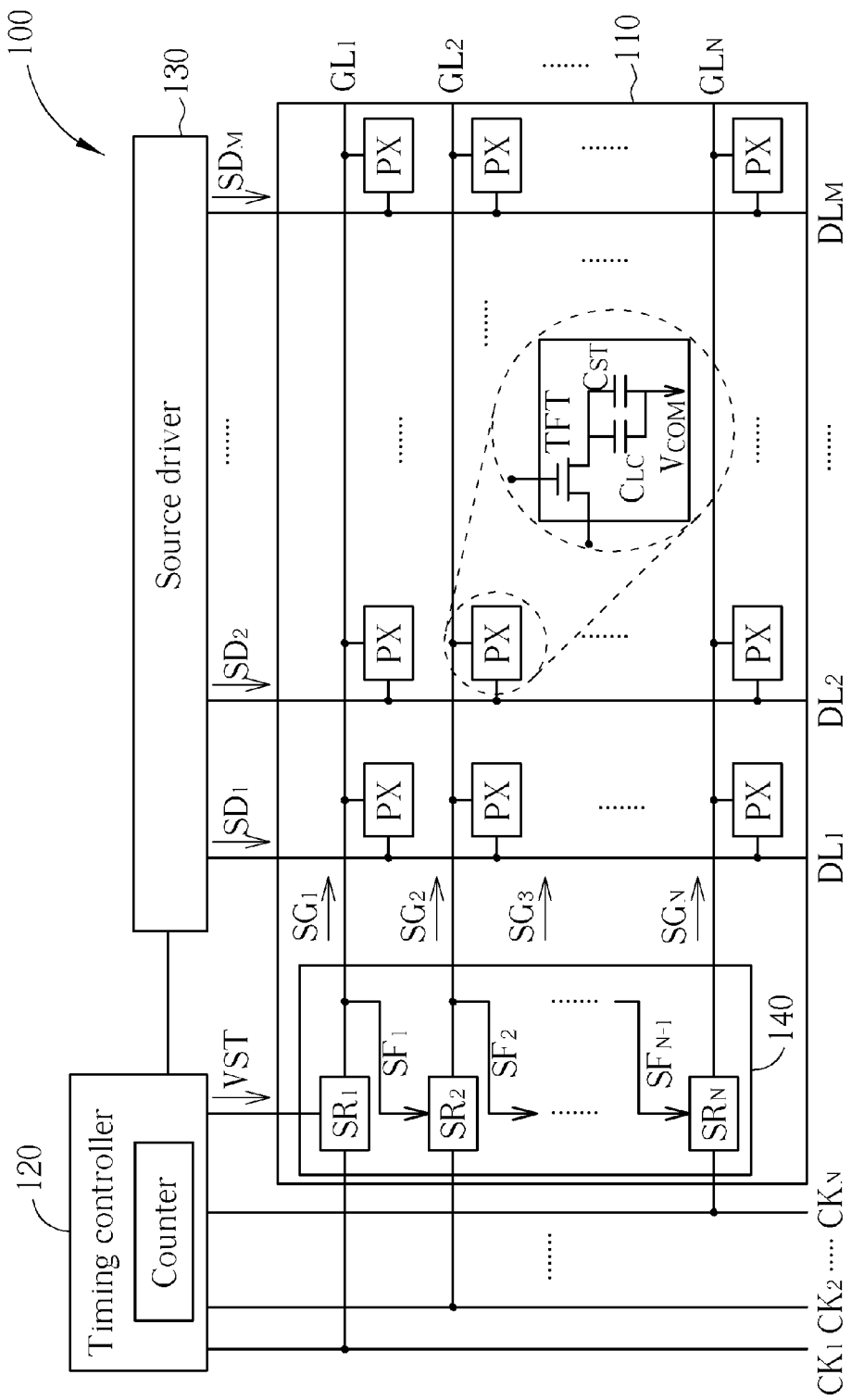
FIG. 1 is a diagram illustrating a prior art LCD device using GOA technology.
Figure 2:
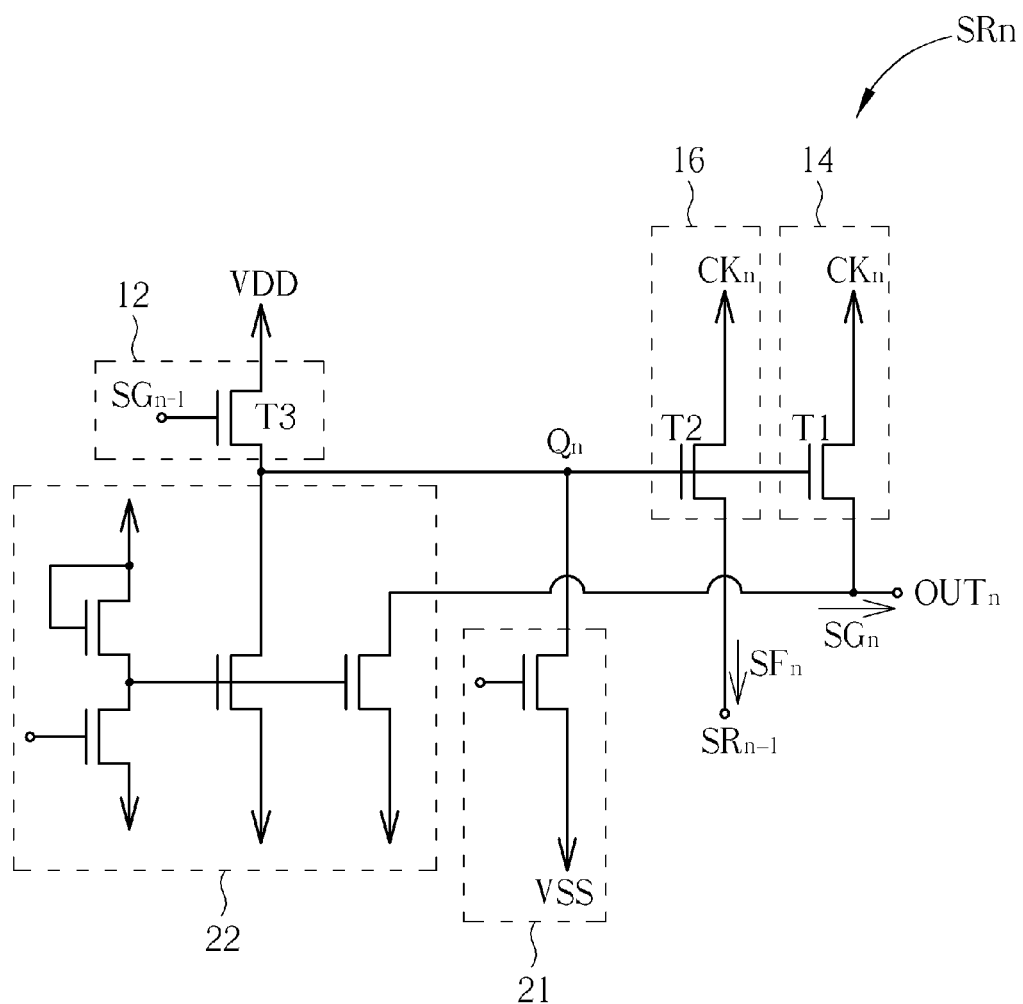
FIG. 2 is a diagram illustrating a prior art shift register unit.
Figure 3:
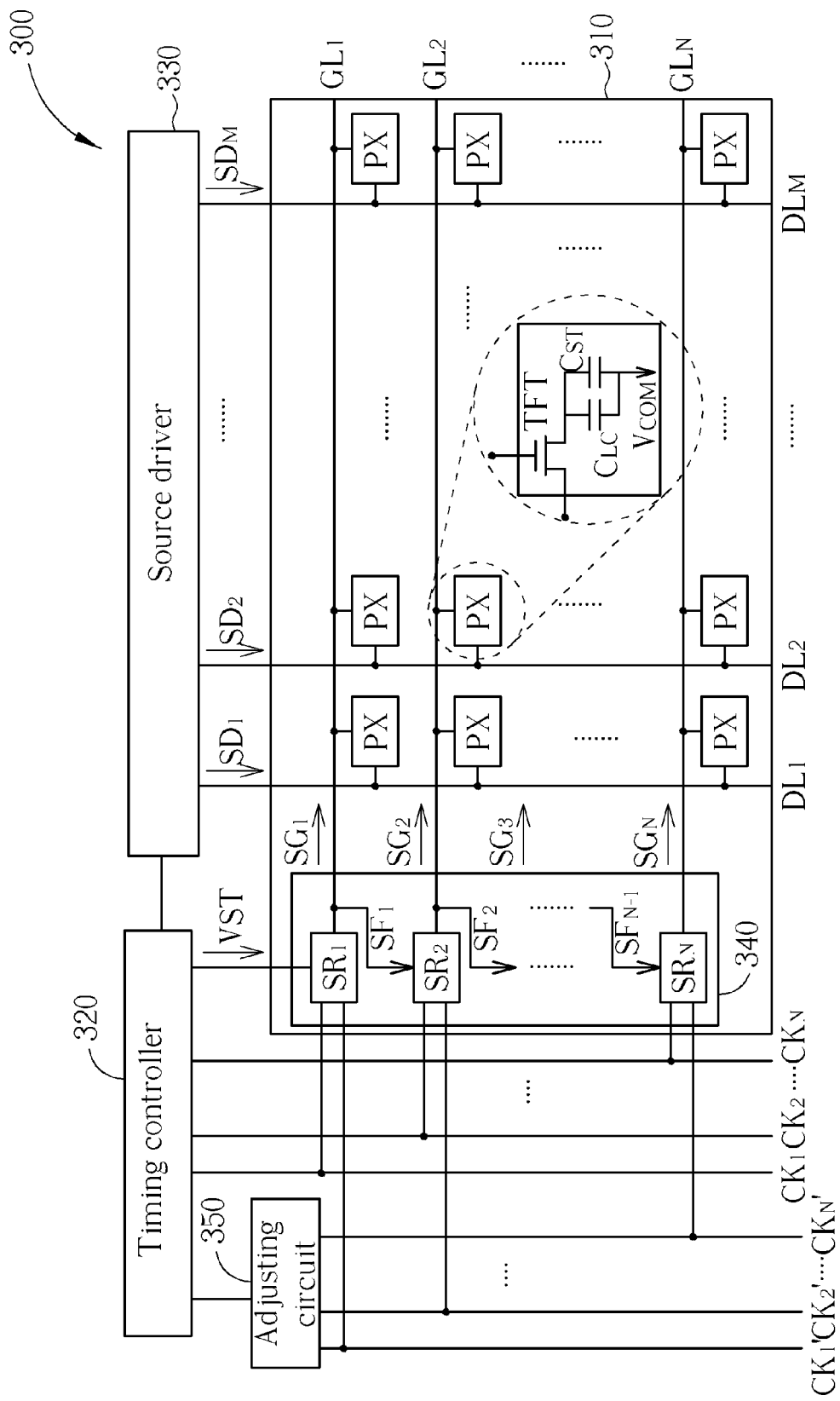
FIG. 3 is a diagram illustrating an LCD device using GOA technology according to the present invention.

FIG. 3 is a diagram illustrating an LCD device 300 using GOA technology according to one embodiment of the present invention. The LCD device 300 includes a display panel 310, a timing controller 320, a source driver 330, a gate driver 340, and an adjusting circuit 350. A plurality of data lines $DL_1$-$DL_M$, a plurality of gate lines $GL_1$-$GL_N$, (M and N are integers larger than 1) and a pixel array having a plurality of pixel units PX are disposed on the display panel 310. Each pixel unit PX, having a thin film transistor switch TFT, a liquid crystal capacitor $C_{LC}$ and a storage capacitor $C_{ST}$, is coupled to a corresponding data line, a corresponding gate line, and a common voltage $V_{COM}$. The timing controller 320 is configured to generate signals for operating the source driver 330 and the gate driver 340, such as a start pulse signal VST, a group of first clock signals $CK_1$-$CK_N$, and a group of second clock signals $CK_1'$-$CK_N'$. Each clock signal periodically switches between an enable level and a disable level, and the driving ability of the second clock signals $CK_1'$-$CK_N'$ is higher the driving ability of the first clock signals $CK_1$-$CK_N$. After the gate driver 340 has been activated over a predetermined period of time, the adjusting circuit 350 may start to decrease the driving ability of the second clock signals $CK_1'$-$CK_N'$ gradually.

The source driver 330 is configured to generate data driving signals $SD_1$-$SD_M$ associated with display images, thereby charging the corresponding pixel units PX. The gate driver 340 includes a plurality of shift register units $SR_1$-$SR_N$ coupled in series and configured to sequentially output gate driving signals $SG_1$-$SG_N$ to the corresponding gate lines $GL_1$-$GL_N$ according to the start pulse signal VST, the corresponding first clock signals $CK_1$-$CK_N$, and the corresponding second clock signals $CK_1'$-$CK_N'$. The thin film transistor switches TFT in the corresponding pixel units PX may thus be turned on, and forward driving signals $SF_1$-$SF_N$ may be sequentially generated for triggering the corresponding next-stage shift register units.

In the LCD device 300 according to one embodiment of the present invention, each shift register unit selectively transmits a corresponding clock signal among the first clock signals $CK_1$-$CK_N$ to its output end, and selectively transmits a correspond clock signal among the second clock signals $CK_1'$-$CK_N'$ to its corresponding next-stage shift register unit. Since the driving ability of the second clock signals $CK_1'$-$CK_N'$ is higher the driving ability of the first clock signals $CK_1$-$CK_N$, each shift register unit may trigger its corresponding next-stage shift register unit with a stronger forward driving signal for improving cold-start. Since cold-start is no longer an issue when the gate driver 340 has warmed up after having been activated over a predetermined period of time, the driving ability of the second clock signals $CK_1'$-$CK_N'$ may gradually be lowered for reducing power consumption.

Figure 4A:
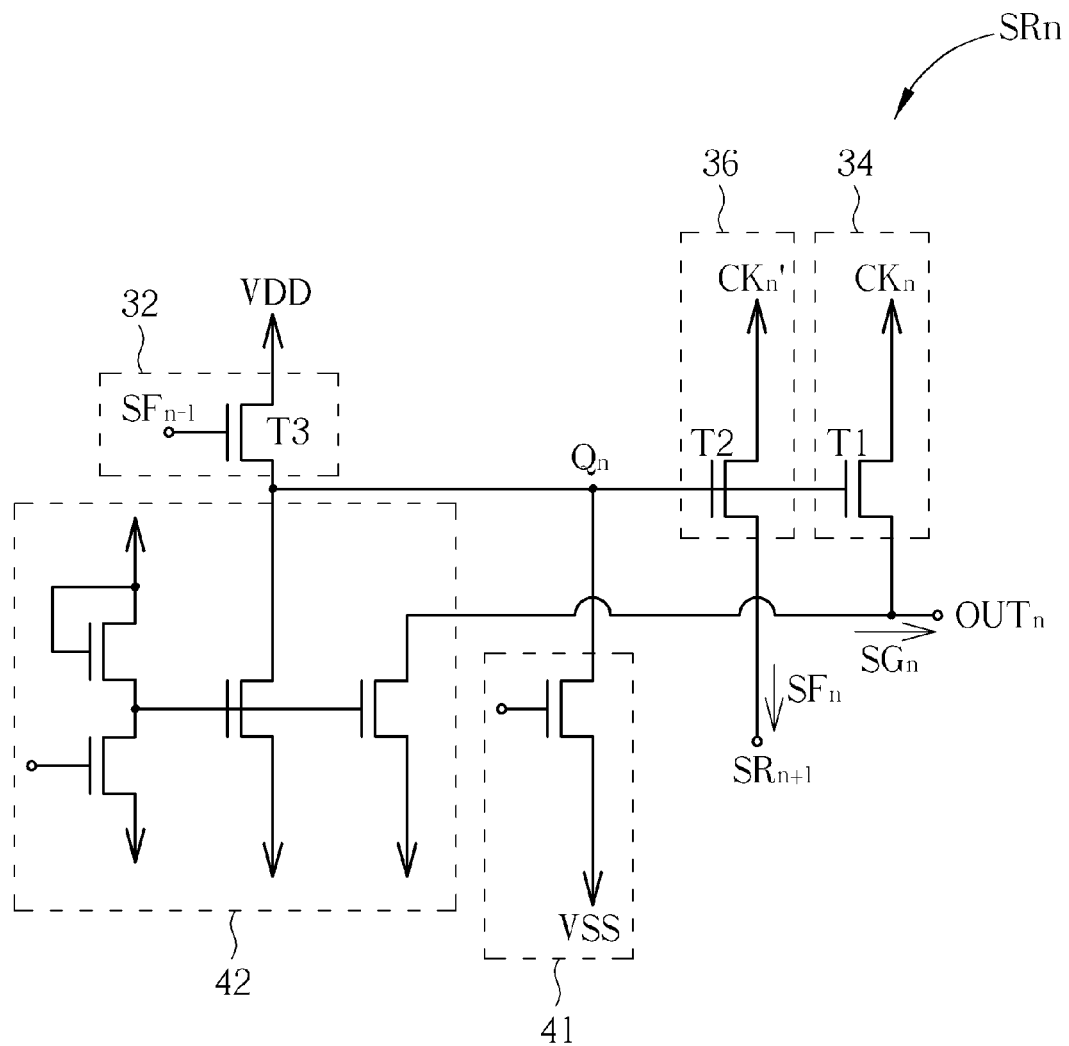
FIGS. 4A-4C are diagrams illustrating a shift register unit according to the present invention.
Figure 4B:
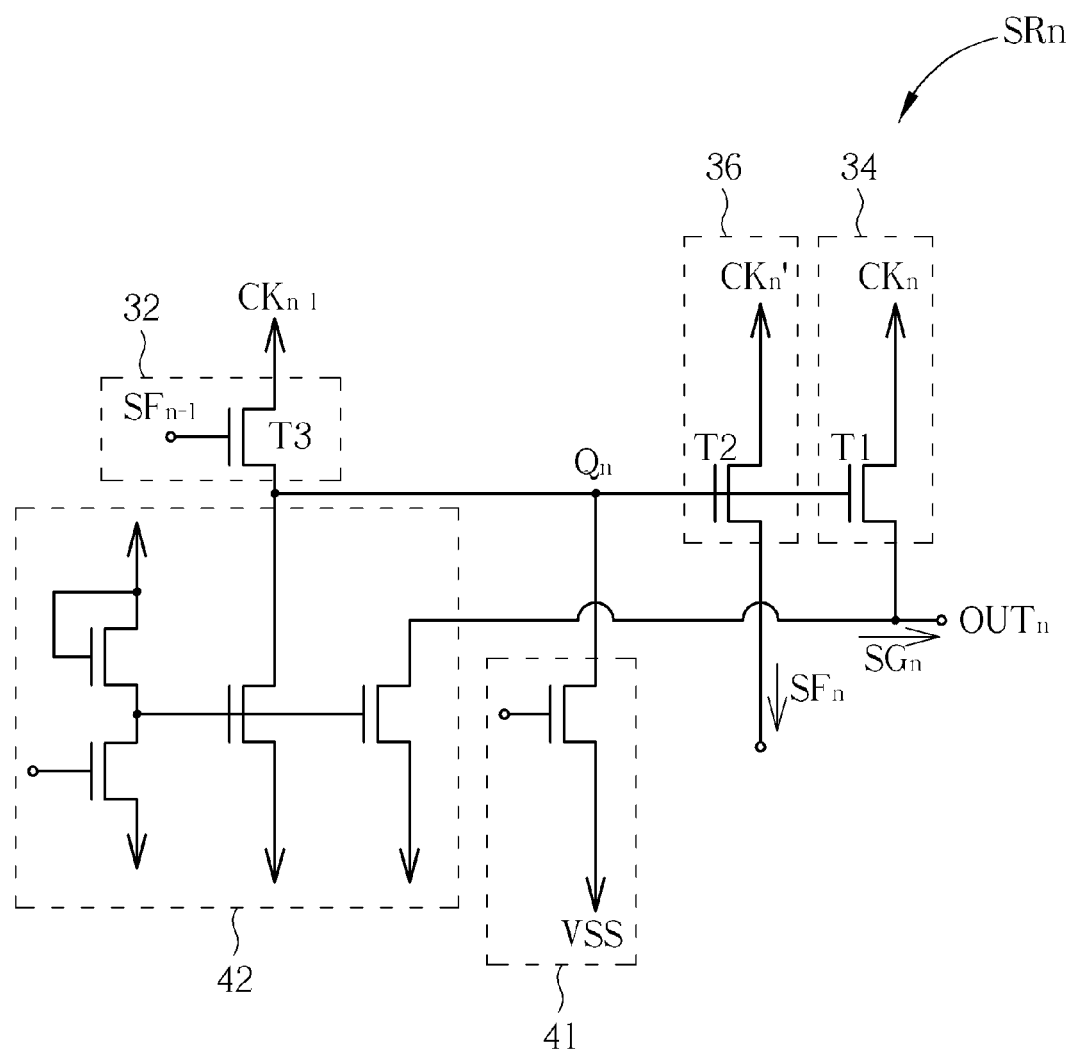
Figure 4C:
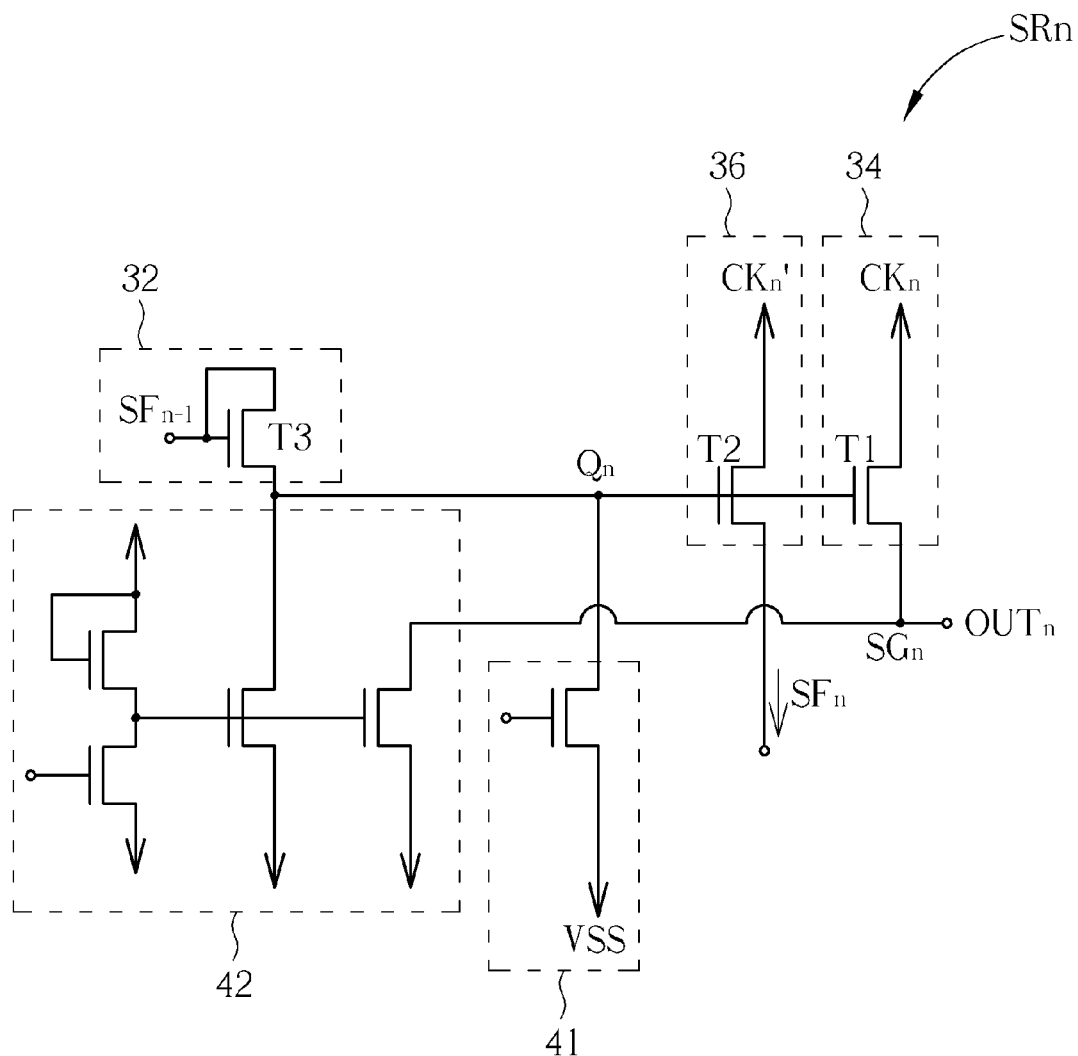

FIGS. 4A-4C are diagrams illustrating an $n^{th}$-stage shift register unit $SR_n$ according to the present invention (n is an integer between 1 and N). In these embodiments, the shift register unit $SR_n$ includes an output end $OUT_n$, a node $Q_n$, an input circuit 32, a pull-up circuit 34, a forward circuit 36, a first pull-down circuit 41, and a second pull-down circuit 42.

The input circuit 32 includes a transistor switch T3. In the embodiment illustrated in FIG. 4A, the transistor switch T3 includes a control end coupled to the $(n-1)^{th}$-stage shift register unit $SR_{n-1}$ for receiving the forward driving signal $SF_{n-1}$, a first end coupled to a bias voltage VDD, and a second end coupled to the node $Q_n$. In the embodiment illustrated in FIG. 4B, the transistor switch T3 includes a control end coupled to the $(n-1)^{th}$-stage shift register unit $SR_{n-1}$ for receiving the forward driving signal $SF_{n-1}$, a first end coupled to the clock signal $CK_{n-1}$ which controls the output of the $(n-1)^{th}$-stage shift register unit $SR_{n-1}$, and a second end coupled to the node $Q_n$. In the embodiment illustrated in FIG. 4C, the transistor switch T3 includes a control end and a first end coupled to the $(n-1)^{th}$-stage shift register unit $SR_{n-1}$ for receiving the forward driving signal $SF_{n-1}$, and a second end coupled to the node $Q_n$. The voltage level of the bias voltage VDD and the enable level of the clock signal $CK_{n-1}$ are higher than the turn-on voltages of the pull-up circuit 34 and the forward circuit 36.

In the embodiments illustrated in FIGS. 4A-4C, the pull-up circuit 34 includes a transistor switch T1 having a control end coupled to the node $Q_n$, a first end coupled to the clock signal $CK_n$, and a second end coupled to the output end $OUT_n$. The forward circuit 36 includes a transistor switch T2 having a control end coupled to the node $Q_n$, a first end coupled to the clock signal $CK_n'$, and a second end coupled to the $(n+1)^{th}$-stage shift register unit $SR_{n+1}$. According to the voltage level of the node $Q_n$, the pull-up circuit 34 selectively transmits the clock signal $CK_n$ to the output end $Q_n$ for supplying the gate driving signal $SG_n$, while the forward circuit 36 selectively transmits the clock signal $CK_n'$ to the $(n+1)^{th}$-stage shift register unit $SR_{n+1}$ for supplying the forward driving signal $SF_n$.

Figure 5A:
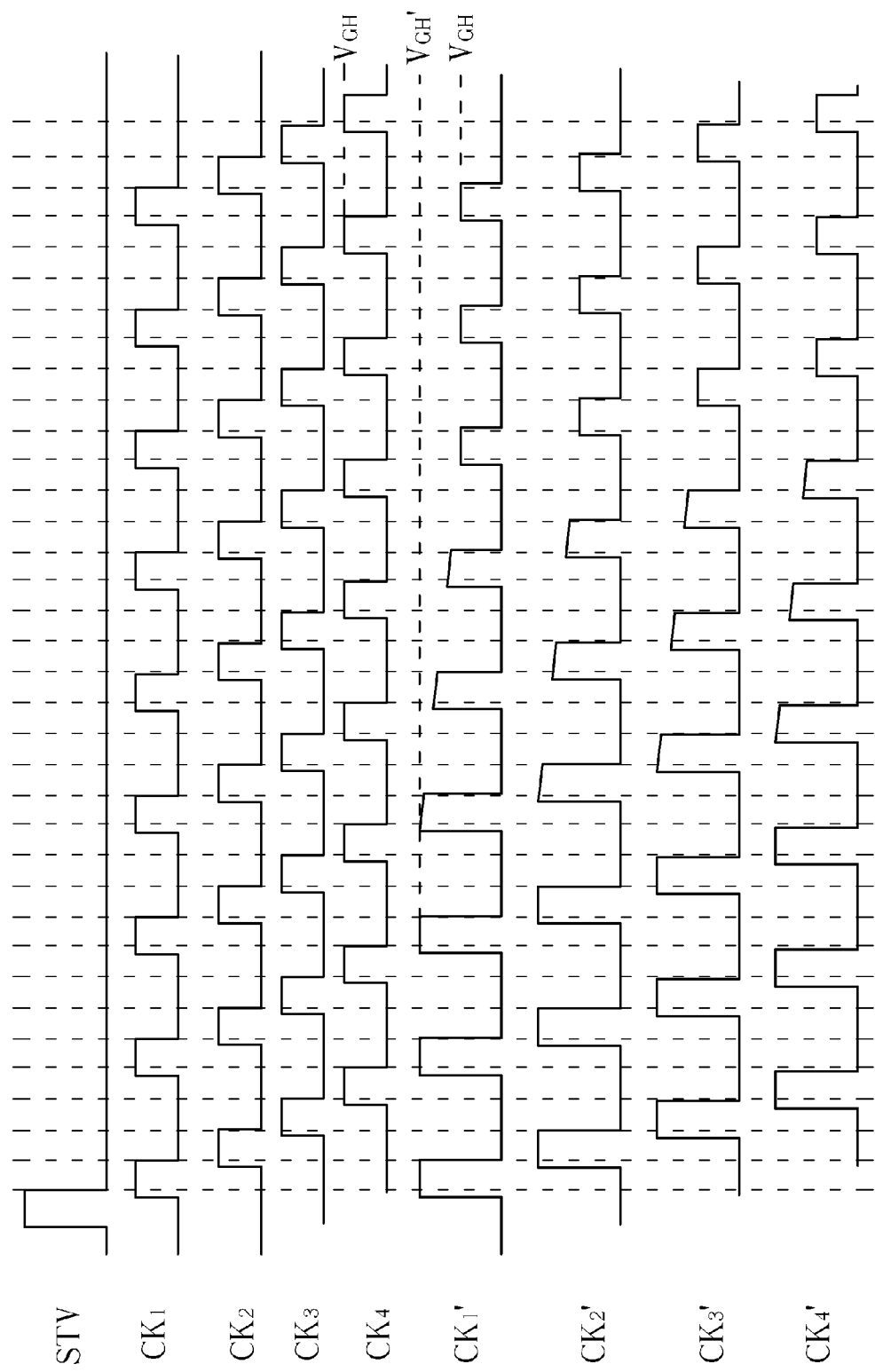
FIGS. 5A-5E and 6 are timing diagrams illustrating the operation of the LCD device according to the present invention.
Figure 5B:
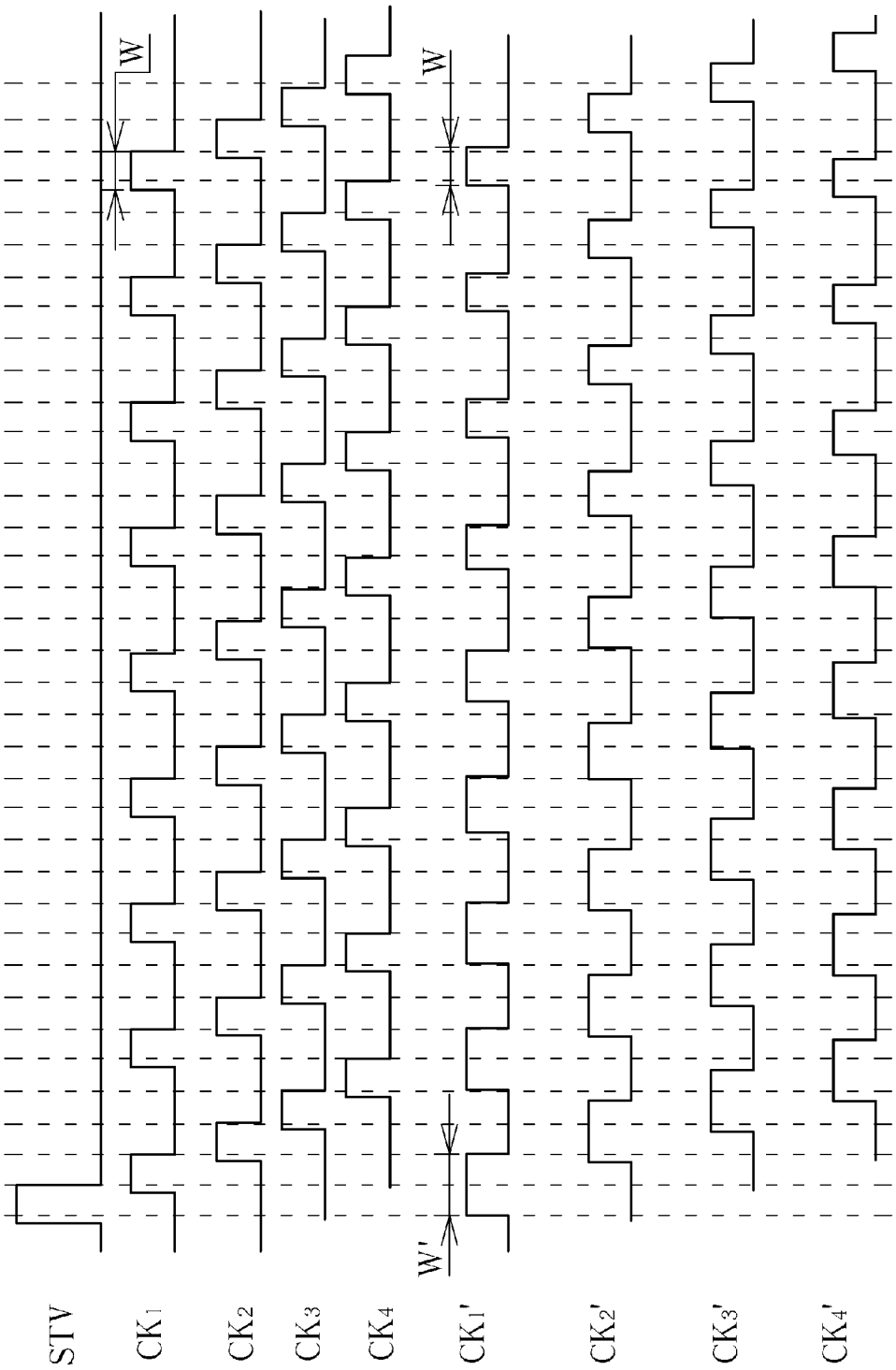
Figure 5C:
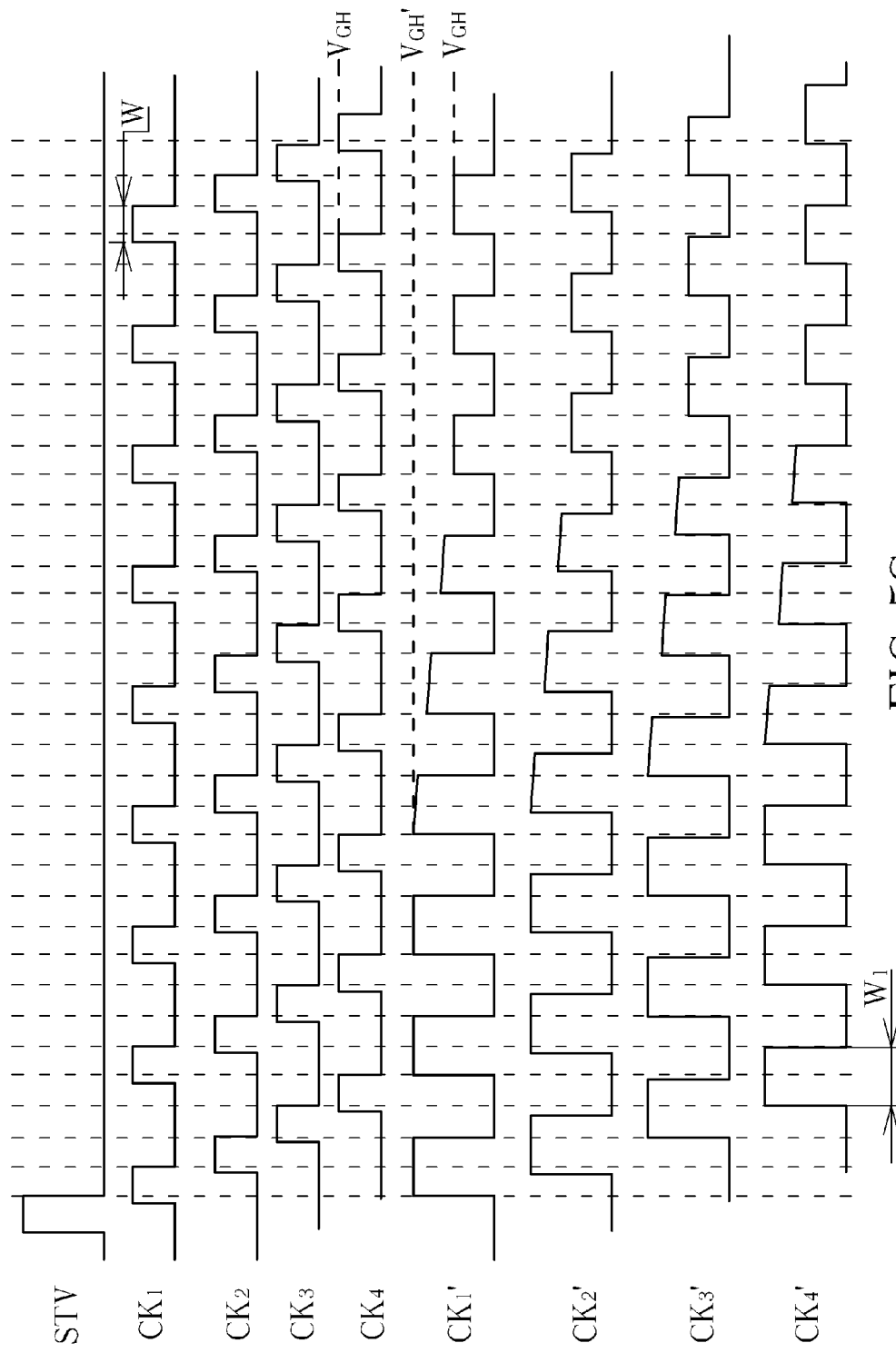
Figure 5D:
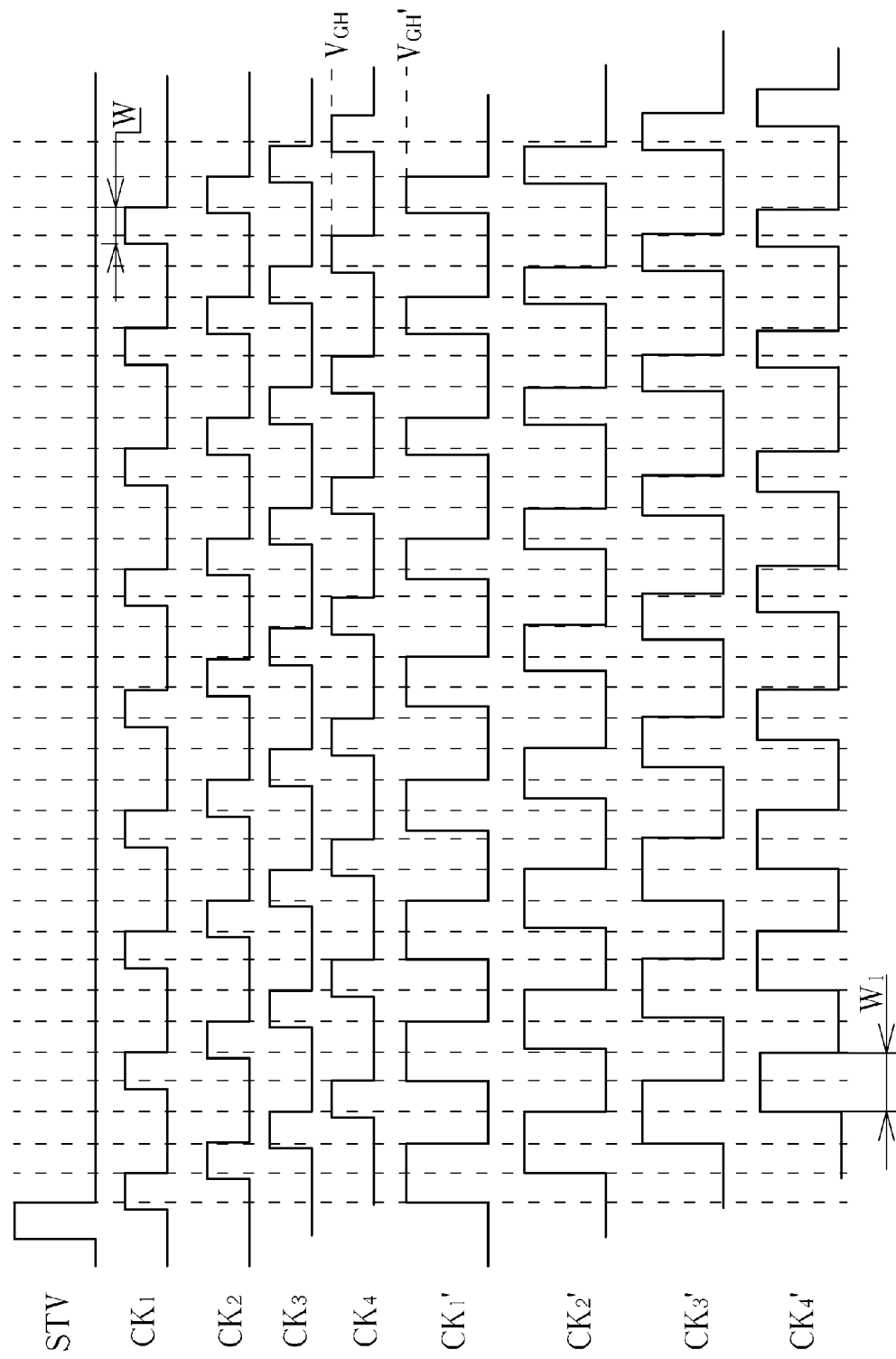
Figure 5E:
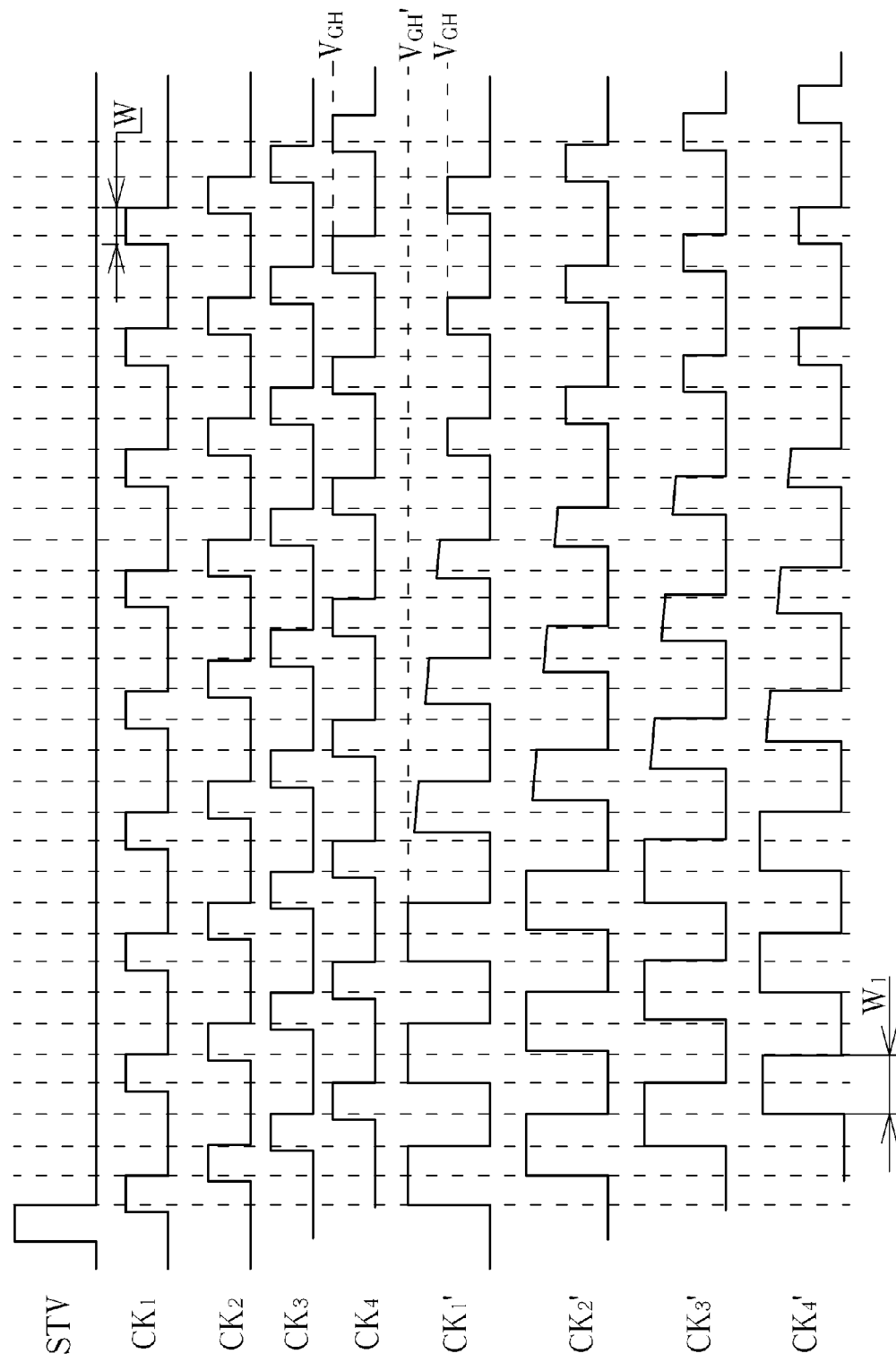
Figure 6:
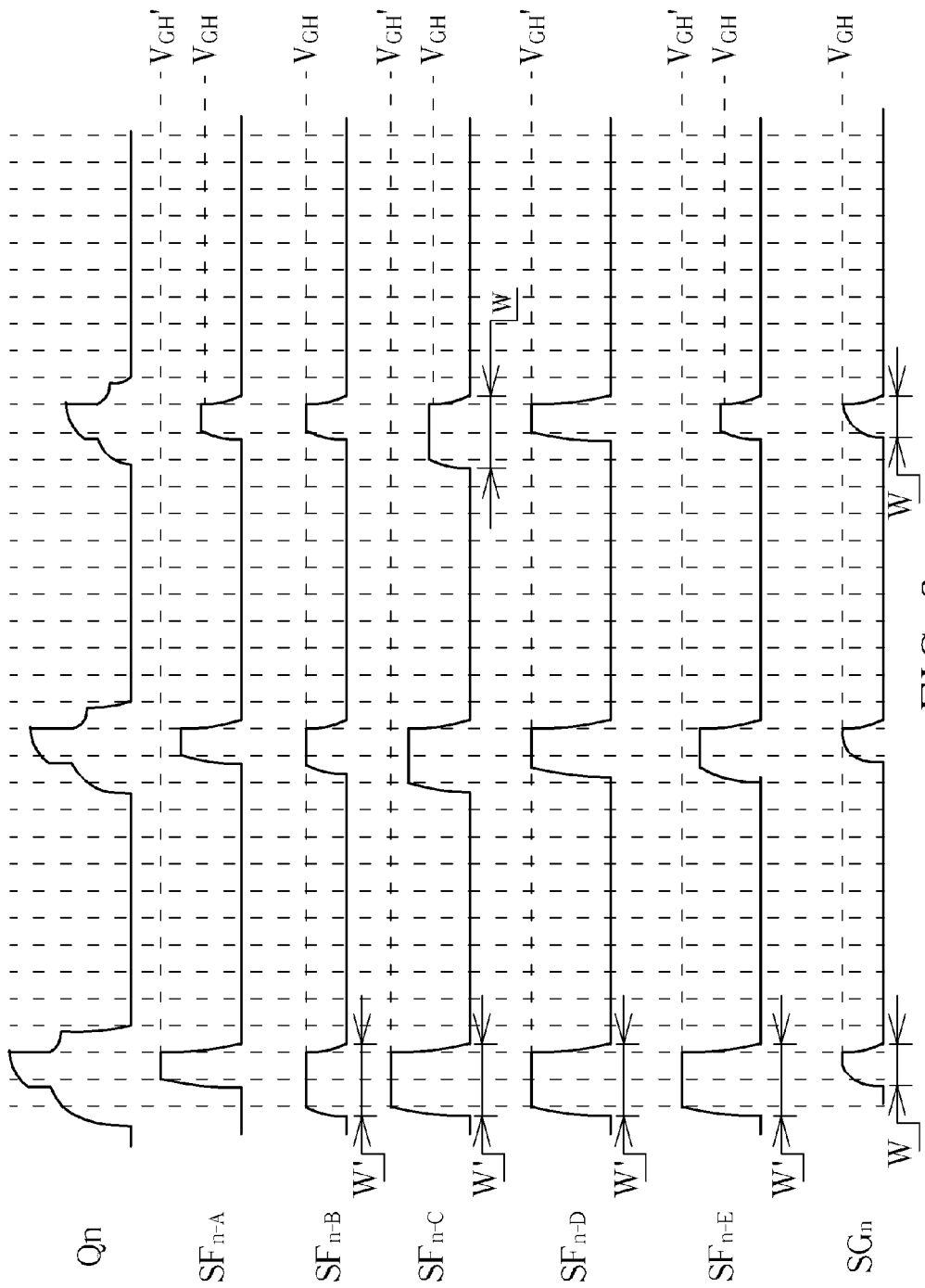

FIGS. 5A-5E and 6 are timing diagrams illustrating the operation of the LCD device 300 according to the present invention. FIGS. 5A-5E show the waveforms of the first clock signals $CK_1$-$CK_4$ and the second clock signals $CK_1'$-$CK_4'$. FIG. 6 shows the waveforms of the gate driving signals $SG_n$ and the forward driving signal $SF_n$.

In the embodiment illustrated in FIG. 5A, the high level $V_{GH}'$ of the second clock signals $CK_1'$-$CK_4'$ is larger than the high level $V_{GH}$ of the first clock signals $CK_1$-$CK_4$ in the beginning of the start-up sequence. Therefore, the second clock signals $CK_1'$-$CK_4'$ having larger pulse amplitude may drive the transistor switches with higher gate voltages, thereby improving cold-start. After the LCD device 300 has been activated over a predetermined period of time, the high level of the first clock signals $CK_1$-$CK_4$ is maintained at $V_{GH}$, while the high level of the second clock signals $CK_1'$-$CK_4'$ is gradually reduced to $V_{GH}$ for reducing power consumption. Meanwhile, there is no flicker since the gate voltages of the transistor switches gradually drop with the level of the second clock signals $CK_1'$-$CK_4'$.

In the embodiment illustrated in FIG. 5B, the pulse width W' of the second clock signals $CK_1'$-$CK_4'$ is larger than the pulse width W of the first clock signals $CK_1$-$CK_4$ in the beginning of the start-up sequence. Therefore, the second clock signals $CK_1'$-$CK_4'$ having longer duty cycle may drive the transistor switches with longer turn-on time, thereby improving cold-start. After the LCD device 300 has been activated over a predetermined period of time, the pulse width of the first clock signals $CK_1$-$CK_4$ is maintained at W, while the pulse width of the second clock signals $CK_1'$-$CK_4'$ is gradually reduced to W' for reducing power consumption.

In the embodiment illustrated in FIG. 5C, the high level $V_{GH}'$ of the second clock signals $CK_1'$-$CK_4'$ is larger than the high level $V_{GH}$ of the first clock signals $CK_1$-$CK_4$, and the pulse width W' of the second clock signals $CK_1'$-$CK_4'$ is larger than the pulse width W of the first clock signals $CK_1$-$CK_4$ in the beginning of the start-up sequence. Therefore, the second clock signals $CK_1'$-$CK_4'$ having larger pulse amplitude and longer duty cycle may drive the transistor switches with higher gate voltages and longer turn-on time, thereby improving cold-start. After the LCD device 300 has been activated over a predetermined period of time, the high level of the first clock signals $CK_1$-$CK_4$ is maintained at $V_{GH}$, the pulse width of the first clock signals $CK_1$-$CK_4$ is maintained at W, the pulse width of the second clock signals $CK_1'$-$CK_4'$ is maintained at W', while the high level of the second clock signals $CK_1'$-$CK_4'$ is gradually reduced to $V_{GH}$ for reducing power consumption. Meanwhile, there is no flicker since the gate voltages of the transistor switches gradually drop with the level of the second clock signals $CK_1'$-$CK_4'$.

In the embodiment illustrated in FIG. 5D, the high level $V_{GH}'$ of the second clock signals $CK_1'$-$CK_4'$ is larger than the high level $V_{GH}$ of the first clock signals $CK_1$-$CK_4$, and the pulse width W' of the second clock signals $CK_1'$-$CK_4'$ is larger than the pulse width W of the first clock signals $CK_1$-$CK_4$ in the beginning of the start-up sequence. Therefore, the second clock signals $CK_1'$-$CK_4'$ having larger pulse amplitude and longer duty cycle may drive the transistor switches with higher gate voltages and longer turn-on time, thereby improving cold-start. After the LCD device 300 has been activated over a predetermined period of time, the high level of the first clock signals $CK_1$-$CK_4$ is maintained at $V_{GH}$, the high level of the second clock signals $CK_1'$-$CK_4'$ is maintained at $V_{GH}'$, the pulse width of the first clock signals $CK_1$-$CK_4$ is maintained at W, while the pulse width of the second clock signals $CK_1'$-$CK_4'$ is gradually reduced to W for reducing power consumption.

In the embodiment illustrated in FIG. 5E, the high level $V_{GH}'$ of the second clock signals $CK_1'$-$CK_4'$ is larger than the high level $V_{GH}$ of the first clock signals $CK_1$-$CK_4$, and the pulse width W' of the second clock signals $CK_1'$-$CK_4'$ is larger than the pulse width W of the first clock signals $CK_1$-$CK_4$ in the beginning of the start-up sequence. Therefore, the second clock signals $CK_1'$-$CK_4'$ having larger pulse amplitude and longer duty cycle may drive the transistor switches with higher gate voltages and longer turn-on time, thereby improving cold-start. After the LCD device 300 has been activated over a predetermined period of time, the high level of the first clock signals $CK_1$-$CK_4$ is maintained at $V_{GH}$ and the pulse width of the first clock signals $CK_1$-$CK_4$ is maintained at W, while the high level of the second clock signals $CK_1'$-$CK_4'$ is gradually reduced to $V_{GH}$ and the pulse width of the second clock signals $CK_1'$-$CK_4'$ is gradually reduced to W for reducing power consumption. Meanwhile, there is no flicker since the gate voltages of the transistor switches gradually drop with the level of the second clock signals $CK_1'$-$CK_4'$.

For the $n^{th}$-stage shift register unit $SR_n$, the forward driving signals generated in the embodiments illustrated in FIGS. 5A-5E are depicted as $SF_{n-A}$-$SF_{n-E}$ in FIG. 6. The waveforms of the node $Q_n$, the gate driving signals $SG_n$ and the forward driving signal $SF_{n-A}$-$SF_{n-E}$ in the beginning of the start-up sequence are depicted on the left of FIG. 6. The waveforms of the node $Q_n$, the gate driving signals $SG_n$ and the forward driving signal $SF_{n-A}$-$SF_{n-E}$ after the LCD device 300 has been activated over a predetermined period of time are depicted in the middle of FIG. 6. The waveforms of the node $Q_n$, the gate driving signals $SG_n$ and the forward driving signal $SF_{n-A}$-$SF_{n-E}$ after adjustment are depicted on the right of FIG. 6. As depicted in FIG. 6, the pulse amplitude of the forward driving signal $SF_{n-A}$ is larger than the pulse amplitude of the gate driving signal $SG_n$, the pulse width of the forward driving signal $SF_{n-B}$ is larger than the pulse width of the gate driving signal $SG_n$, and the pulse amplitude and the pulse width of the forward driving signals $SF_{n-C}$-$SF_{n-E}$ are larger than the pulse amplitude and the pulse width of the gate driving signal $SG_n$ in the beginning of the start-up sequence, thereby capable of improving cold-start by providing higher driving ability. After the LCD device 300 has been activated over a predetermined period of time, the pulse amplitude or/and the pulse width of the forward driving signals $SF_{n-A}$-$SF_{n-E}$ is/are gradually decreased for reducing power consumption. Meanwhile, there is no flicker since the pulse amplitude or the pulse width of the forward driving signals $SF_{n-A}$-$SF_{n-E}$ gradually changes.

In the LCD device 300 according to the present invention, the first pull-down circuit 41 is configured to stabilize the voltage level of the node $Q_n$, while the second pull-down circuit 42 is configured to stabilize the voltage level of the output voltage. The first pull-down circuit 41 and the second pull-down circuit 42 may adopt various structures well-known to those skilled in the art, such as, but not limited to, those illustrated in FIGS. 4A-4C. Meanwhile, the transistor switches T1-T3 may be MOS switches or other devices having similar functions.

The present LCD device is configured to drive a plurality of shift register units using two clock signals having different driving abilities. Each shift register unit may thus generate a stronger signal for triggering a corresponding next-stage shift register unit, thereby improving cold-start. When the present LCD device has been activated over a predetermined period of time, the driving ability of the clock signal having higher driving ability is gradually lowered, thereby reducing power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A driving circuit, comprising:
   a plurality of shift register units among which an $N^{th}$-stage shift register unit includes:
      a node;
      an input circuit configured to maintain a voltage level of the node according to signals received from an $X^{th}$-stage shift register unit among the plurality of shift register units;

a pull-up circuit configured to selectively couple a first clock signal to an output end of the $N^{th}$-stage shift register unit according to the voltage level of the node; and a pull-down circuit configured to selectively couple a second clock signal to a $Y^{th}$-stage shift register unit among the plurality of shift register units according to the voltage level of the node, wherein a duty cycle of the second clock signal is larger than a duty cycle of the first clock signal, N is an integer larger than 1, X is a positive integer smaller than N, and Y is an integer larger than N; and an adjusting circuit configured to gradually shorten the duty cycle of the second clock signal after the driving circuit has been activated over a predetermined period of time.

2. The driving circuit of claim 1, wherein a pulse amplitude of the second clock signal is larger than a pulse amplitude of the first clock signal.

3. The driving circuit of claim 2, wherein the adjusting circuit configured to gradually reduce the pulse amplitude of the second clock signal after the driving circuit has been activated over the predetermined period of time.

4. The driving circuit of claim 1, wherein:

the pull-up circuit includes a first switch having:
a control end coupled to the node;
a first end for receiving the first clock signal; and
a second end coupled to the output end of the $N^{th}$-stage shift register unit; and the pull-down circuit includes a second switch having:
a control end coupled to the node;
a first end for receiving the second clock signal; and
a second end coupled to the $Y^{th}$-stage shift register unit.

5. A driving circuit, comprising:

a plurality of shift register units among which an $N^{th}$-stage shift register unit includes:
a node;
an input circuit configured to maintain a voltage level of the node according to signals received from an $X^{th}$-stage shift register unit among the plurality of shift register units;
a pull-up circuit configured to selectively couple a first clock signal to an output end of the $N^{th}$-stage shift register unit according to the voltage level of the node; and
a pull-down circuit configured to selectively couple a second clock signal to a $Y^{th}$-stage shift register unit among the plurality of shift register units according to the voltage level of the node, wherein a pulse amplitude of the second clock signal is larger than a pulse amplitude of the first clock signal, a duty cycle of the second clock signal is larger than a duty cycle of the first clock signal, N is an integer larger than 1, X is a positive integer smaller than N, and Y is an integer larger than N; and an adjusting circuit configured to gradually reduce the pulse amplitude of the second clock signal and gradually shorten a duty cycle of the second clock signal after the driving circuit has been activated over a predetermined period of time.

6. A method for driving a liquid crystal display device by providing a plurality of driving signals respectively during a plurality of driving periods, the method comprising:

during an $N^{th}$-stage driving period among the plurality of driving periods, providing a first clock signal for supplying an $N^{th}$-stage driving signal among the plurality of driving signals and providing a second clock signal for supplying a trigger signal for an $(N+1)^{th}$-stage driving period among the plurality of driving periods, wherein a duty cycle of the second clock signal is larger than a duty cycle of the first clock signal and N is a positive integer; and gradually reducing the duty cycle of the second clock signal after the liquid crystal device has been activated over a predetermined period of time.

7. The method of claim 6, further comprising:
providing the first and second clock signals so that a pulse amplitude of the second clock signal is larger than a pulse amplitude of the first clock signal.

8. The method of claim 7, further comprising:
gradually reducing the pulse amplitude of the second clock signal after the liquid crystal device has been activated over the predetermined period of time.

9. A method for driving a liquid crystal display device by providing a plurality of driving signals respectively during a plurality of driving periods, the method comprising:

during an $N^{th}$-stage driving period among the plurality of driving periods, providing a first clock signal for supplying an $N^{th}$-stage driving signal among the plurality of driving signals and providing a second clock signal for supplying a trigger signal for an $(N+1)^{th}$-stage driving period among the plurality of driving periods, wherein a pulse amplitude of the second clock signal is larger than a pulse amplitude of the first clock signal, a duty cycle of the second clock signal is larger than a duty cycle of the first clock signal, and N is a positive integer; and gradually reducing the pulse amplitude of the second clock signal and gradually reducing the duty cycle of the second clock signal after the liquid crystal device has been activated over a predetermined period of time.

* * * * *